United States Patent
Pillarisetty et al.

(10) Patent No.: US 10,811,336 B2
(45) Date of Patent: Oct. 20, 2020

(54) TEMPERATURE MANAGEMENT OF ELECTRONIC CIRCUITRY OF ELECTRONIC DEVICES, MEMORY DEVICES, AND COMPUTING DEVICES

(71) Applicant: INTEL CORPORATION, Santa Clara, CA (US)

(72) Inventors: Ravi Pillarisetty, Portland, OR (US); Abhishek A. Sharma, Hillsboro, OR (US); Elijah V. Karpov, Portland, OR (US); Prashant Majhi, San Jose, CA (US); Brian S. Doyle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/966,577

(22) Filed: Apr. 30, 2018

(65) Prior Publication Data

US 2019/0333839 A1 Oct. 31, 2019

(51) Int. Cl.
| | |
|---|---|
| *H01L 23/38* | (2006.01) |
| *H01L 27/24* | (2006.01) |
| *H01L 23/34* | (2006.01) |
| *H01L 27/16* | (2006.01) |
| *H01L 45/00* | (2006.01) |
| *H01L 35/30* | (2006.01) |
| *H01L 35/16* | (2006.01) |
| *H01L 35/18* | (2006.01) |

(Continued)

(52) U.S. Cl.
CPC ............. *H01L 23/38* (2013.01); *H01L 23/34* (2013.01); *H01L 27/16* (2013.01); *H01L 27/222* (2013.01); *H01L 27/2463* (2013.01); *H01L 35/16* (2013.01); *H01L 35/18* (2013.01); *H01L 35/30* (2013.01); *H01L 43/02* (2013.01); *H01L 45/1286* (2013.01)

(58) Field of Classification Search
CPC ... H01L 35/32–325; H01L 45/145–147; H01L 45/08; H01L 23/3672; H01L 23/36; H01L 23/345; H01L 23/38; H01F 10/329
See application file for complete search history.

(56) References Cited

U.S. PATENT DOCUMENTS

2009/0000652 A1 * 1/2009 von Windheim ....... H01L 23/38
  136/230
2015/0249096 A1 * 9/2015 Lupino ............. H01L 27/11898
  257/203

(Continued)

*Primary Examiner* — Dale E Page
*Assistant Examiner* — Wilner Jean Baptiste
(74) *Attorney, Agent, or Firm* — Schwabe, Williamson & Wyatt, P.C.

(57) ABSTRACT

Electronic devices, memory devices, and computing devices are disclosed. An electronic device includes electronic circuitry, a temperature sensor, a heat sink, at least one thermoelectric material, a thermally conductive material configured to thermally couple the electronic circuitry to the at least one thermoelectric material, and a transistor. The temperature sensor is configured to monitor a temperature of the electronic circuitry. The transistor is configured to selectively enable thermoelectric current to flow through the at least one thermoelectric material and dissipate heat from the thermally conductive material to the heat sink responsive to fluctuations in the temperature of the electronic circuitry detected by the temperature sensor.

11 Claims, 3 Drawing Sheets (51) Int. Cl.
*H01L 43/02* (2006.01)
*H01L 27/22* (2006.01)

(56) References Cited

U.S. PATENT DOCUMENTS

2015/0364667 A1* 12/2015 Jarmon ................ H01L 35/30
            136/208
2016/0334362 A1* 11/2016 Liu .................... G01N 27/4145

* cited by examiner

TEMPERATURE MANAGEMENT OF ELECTRONIC CIRCUITRY OF ELECTRONIC DEVICES, MEMORY DEVICES, AND COMPUTING DEVICES

BACKGROUND

Temperature fluctuations in integrated circuits sometimes affect certain devices within these integrated circuits differently from other devices within these integrated circuits. As a result, the operational temperature range specified for a given integrated circuit may be limited by whichever device or devices reach operational extremities in response to the smallest temperature fluctuations.

DETAILED DESCRIPTION

Described herein are systems and methods of heat dissipation from temperature sensitive electronic circuitry. In the following description, various aspects of the illustrative implementations will be described using terms commonly employed by those skilled in the art to convey the substance of their work to others skilled in the art. However, it will be apparent to those skilled in the art that the disclosure may be practiced with only some of the described aspects. For purposes of explanation, specific numbers, materials and configurations are set forth in order to provide a thorough understanding of the illustrative implementations. However, it will be apparent to one skilled in the art that the disclosure may be practiced without the specific details. In other instances, well-known features are omitted or simplified in order not to obscure the illustrative implementations.

Various operations will be described as multiple discrete operations, in turn, in a manner that is most helpful in understanding the disclosure. The order of the description, however, should not be construed to imply that these operations are necessarily order dependent. In particular, these operations need not be performed in the order of presentation.

The terms "over," "under," "between," and "on," as used herein, refer to a relative position of one material (e.g., region, structure, layer, etc.) or component with respect to other materials (e.g., regions, structures, layers, etc.) or components. For example, one material disposed over, under, or on another material may be directly in contact with the other material or may have one or more intervening materials. Moreover, one material or feature disposed between two materials or features may be directly in contact with the two materials or features or may have one or more intervening materials or features. Moreover, to the extent that the terms "over," "under," and "on" refer to a particular orientation (e.g., a vertical orientation), it will be understood that equivalent structures may be implemented horizontally, diagonally, in some non-linear variation or variations of these orientations, or some combination thereof.

Implementations of the disclosure may be formed or carried out on or in a substrate, such as a semiconductor substrate. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the disclosure.

Transistors of one transistor, one resistor (1T-1R) memory arrays such as embedded non-volatile memory (eNVM) can meet relatively wide-range temperature specifications (e.g., −25 to +125 degrees Celsius). Selectors in one selector, one resistor (1S-1R) memory arrays may be relatively susceptible to fluctuations in temperature during operation. For example, the current-voltage, or equivalently "I-V," characteristics may vary greatly over relatively small temperature fluctuations (e.g., differences of around 0.25 Volts in a threshold voltage of the selector responsive to a temperature variation on the order of just tens of degrees Celsius). Often times, the selectors in these devices may be at least partially thermally coupled to control logic, which may generate more heat than the selectors are capable of handling. As a result, it is often a challenge for manufacturers of memory devices including selectors to meet relatively wide operational temperature specifications.

Figure 1:
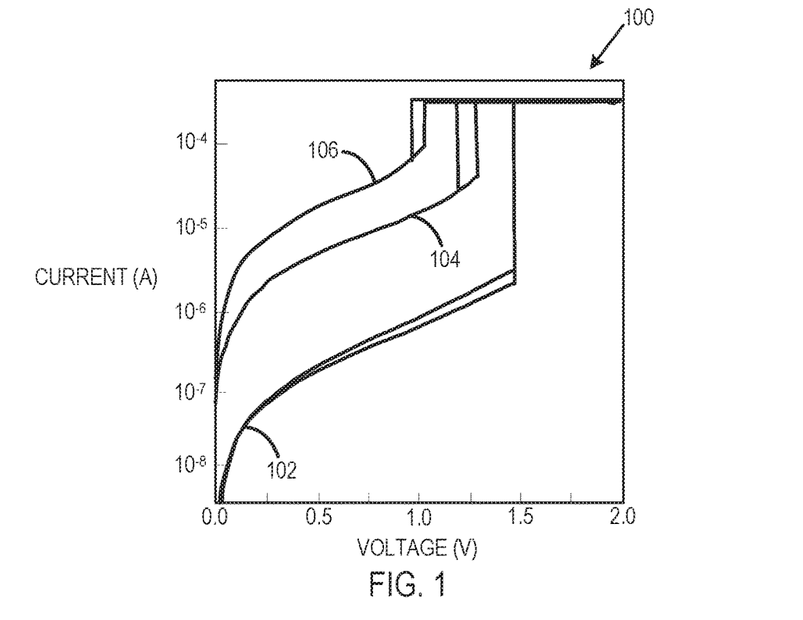
FIG. 1 is a simplified plot illustrating an example of effects of temperature variation on a selector device.

FIG. 1 is a simplified plot 100 illustrating an example of effects of temperature variation on a selector device. The selector device of the example plot 100 includes, for example, a multi-layered nickel oxide (NiO)/niobium oxide (NbO)/nickel oxide (NiO) selector device. The plot 100 includes a 293 Kelvin (K) plot 102, a 423 K plot 104, and a 453 K plot 106, each corresponding to a current (in Amps, or equivalently "A") plotted against voltage (equivalently "V"). As can be seen by the plot 100, the I-V characteristics of selector devices vary relatively significantly as temperature is varied.

Selectors are not the only electronic devices that show relatively strong variation in behavior responsive to temperature fluctuations. For example, voltage controlled oscillators tend to show relatively strong temperature dependence. These, and any other devices that have strong temperature dependence, may benefit from embodiments disclosed herein.

Disclosed herein is management of temperature fluctuations in electronic circuitry (e.g., in 1S-1R arrays), and related systems and devices. In some embodiments, a thermal conductor, such as aluminum nitride (AlN), is used to thermally couple the electronic circuitry to thermoelectric materials. In some embodiments, at least one thermoelectric material (e.g., n-type thermoelectric materials, p-type thermoelectric materials, or both) is used to create a thermoelectric cooler. In some embodiments, a temperature sensor monitors a temperature of the electronic circuitry, and allows (e.g., via a switch such as a transistor) thermoelectric current to flow (which may dissipate heat and cool the electronic circuitry) to regulate temperature. In some embodiments, the electronic circuitry may be thermally isolated from logic, transistors, or other devices in a device layer of an integrated circuit structure by a portion of an interlayer dielectric (ILD) between the electronic circuitry and the device layer (e.g., at least a portion or all of the electronic circuitry may be located in the ILD).

Figure 2:
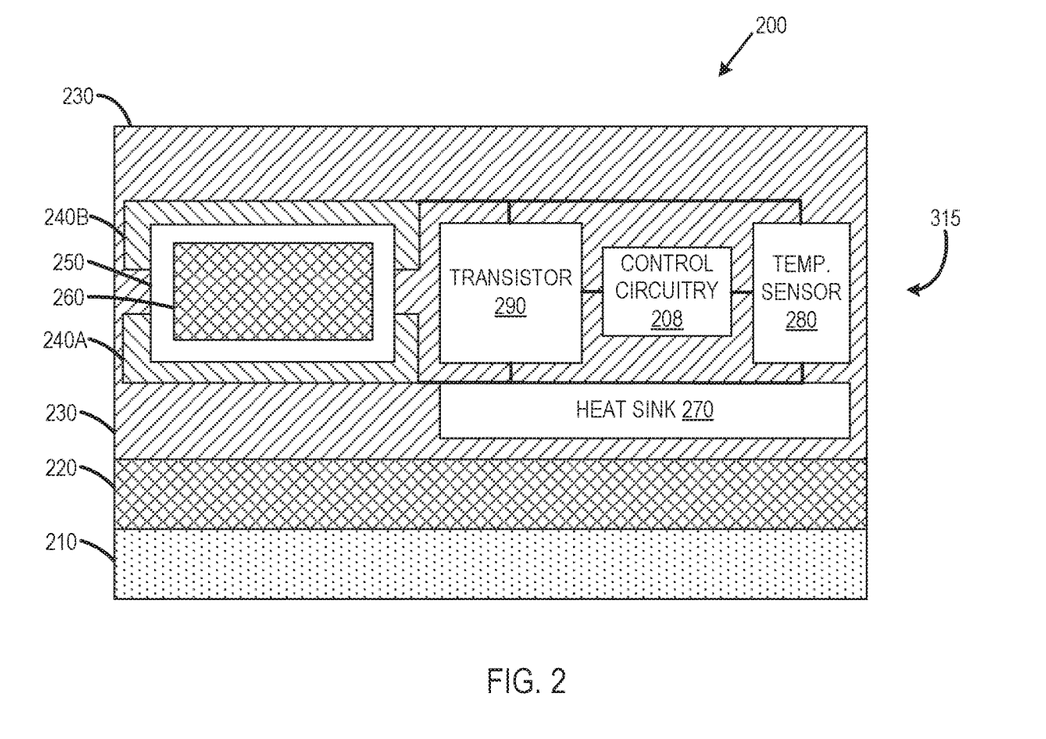
FIG. 2 is a simplified cross-sectional view of an electronic device, according to some embodiments.

FIG. 2 is a simplified cross-sectional view of an electronic device 200, according to some embodiments. The electronic device 200 includes a substrate 210, a device layer 220 on the substrate 210, and an ILD 230 on the device layer 220. The electronic device 200 also includes electronic circuitry 260 at least partially within the ILD 230 (in the example of FIG. 2, the electronic circuitry 260 is completely within the ILD 230; in other examples, however, the electronic circuitry 260 may be partially within the ILD 230 and partially within the device layer 220). In some embodiments, the portion of the ILD 230 that is between the electronic circuitry 260 and the device layer 220 may serve to at least partially insulate the electronic circuitry 260 from heat of the device layer 220.

The electronic device 200 further includes a thermally conductive material 250 thermally coupled to the electronic circuitry 260. The electronic circuitry 260 and the thermally conductive material 250 are between a p-type thermoelectric material 240A and an n-type thermoelectric material 240B (in the example of FIG. 2, the n-type thermoelectric material 240B is on top and the p-type thermoelectric material 240A is on the bottom; in some embodiments the p-type thermoelectric material 240A may be on top with the n-type thermoelectric material 240B on the bottom). The p-type thermoelectric material 240A and the n-type thermoelectric material 240B may sometimes be referred to together herein as "thermoelectric material" 240.

The electronic device 200 also includes a heat sink 270, a temperature sensor 280 configured to monitor a temperature of the electronic circuitry 260, and a transistor 290 configured to selectively enable thermoelectric current to flow through the thermoelectric material 240 based on temperature measurements made by the temperature sensor 280. Accordingly, if the temperature of the electronic circuitry 260 raises above a predetermined threshold temperature level, the transistor 290 may trigger, causing thermoelectric current to flow through the thermoelectric material 240, and drawing heat away from the electronic circuitry 260 and toward the heat sink 270.

The electronic device 200 may include control circuitry 208 electrically coupled to the temperature sensor 280 and the transistor 290. The control circuitry 208 may be configured to trigger the transistor 290 (e.g., turn the transistor 290 on to a conductive state, turn the transistor 290 off to a non-conductive state, or some in between state or states) responsive to a signal (which is correlated to the temperature of the electronic circuitry 260) received from the temperature sensor 280 (e.g., threshold boundaries in the signal from the temperature sensor 280 may be used). By way of non-limiting example, the transistor 290 may be turned on responsive to the signal from the temperature sensor 280 indicating that the temperature of the electronic circuitry 260 falls outside of predetermined threshold boundaries (e.g., exceeding a predetermined threshold level). In some embodiments the control circuitry 208 may be located within the ILD 230. In some embodiments, however, the control circuitry 208 may be included in the device layer 220.

The heat sink 270, the temperature sensor 280, the transistor 290, the control circuitry 208, the thermally conductive material 250, and the thermoelectric material 240 may be included in a heat dissipation system 315. In some embodiments, all or part of the heat dissipation system 315 may be located within the ILD 230. By way of non-limiting example, the thermally conductive material 250, the p-type thermoelectric material 240A, and the n-type thermoelectric material 240B are located within the ILD 230.

In some embodiments, the thermally conductive material 250 includes aluminum nitride (AlN). Other materials that may be included in the thermally conductive material 250 include one or more metals, alloys of metals, nitrides of metals, oxides of metals, other thermally conductive materials, or combinations thereof. By way of non-limiting example, the thermally conductive material 250 may include copper (Cu), aluminum (Al), tungsten (W), titanium (Ti), titanium nitride (TiN), gold (Au), iron (Fe), other materials, or combinations thereof.

The p-type thermoelectric material 240A includes a p-type doped thermoelectric material. By way of non-limiting example, the p-type thermoelectric material 240A may include lead telluride (PbTe), lead telluride (1960) (PbTe 1960), lead selenide telluride (PbSeTe), antimony telluride ($Sb_2Te_3$), tellurium-antimony-germanium-silver (Te/Sb/Ge/Ag) (TAGS), a filled skutterudite ($CeFe_4Sb_{12}$), a zintl compound ($Yb_{14}MnSb_{11}$), silicon germanium (SiGe), other materials, or combinations thereof. The n-type thermoelectric material 240B includes an n-type doped thermoelectric material. By way of non-limiting example, the n-type thermoelectric material 240B may include lead telluride (PbTe), lead telluride (1960) (PbTe 1960), lead selenide telluride (PbSeTe), silicon germanium (SiGe), bismuth telluride ($Bi_2Te_3$), a skutterudite ($CoSb_3$), lanthanum telluride ($La_3Te_4$), other materials, or combinations thereof.

In some embodiments, the p-type thermoelectric material 240A is located at a first side of the thermally conductive material 250 and the n-type thermoelectric material 240B is located on a second side of the thermally conductive material 250 opposite the first side.

The heat sink 270 may include a thermally conductive material that has a geometry designed to dissipate heat. By way of non-limiting example, the heat sink 270 may have a relatively large surface area to volume ratio. In some embodiments, The heat sink 270 may also include one or more portions configured to carry heat from near the electronic circuitry 260 to one or more portions of the heat sink 270 that have large surface area to volume ratios, or to portions of the electronic device 200 that are less susceptible to temperature fluctuations.

The temperature sensor 280 may include a device that has measureable differences in characteristics responsive to temperature fluctuations. By way of non-limiting example, the temperature sensor 280 may include a device that varies in resistance, threshold voltage (e.g., a diode or a transistor), or other measurable parameter responsive to temperature variations. The temperature sensor 280 may be located proximately to the electronic circuitry 260 so that temperature fluctuations in or near the temperature sensor 280 reflect temperature fluctuations of the electronic circuitry 260. In some embodiments, the temperature sensor 280 may be thermally coupled to the electronic circuitry 260 (e.g., by the electrically conductive material 250).

The transistor 290 may include a Metal-Oxide-Semiconductor Field-Effect-Transistor (MOSFET) (e.g., an n-type MOSFET or a p-type MOSFET). In some embodiments, the transistor 290 may be replaced by some other switching device. The transistor 290 may have its gate electrically connected to the control circuitry 208 to enable the control circuitry 208 to turn the transistor on and off responsive to the signal from the temperature sensor 280. The transistor may selectively electrically connect the p-type thermoelectric material 240A to the n-type thermoelectric material 240B.

In some embodiments, the electronic circuitry 260 includes an array of memory cells. By way of non-limiting example, the array of memory cells includes an array of embedded non-volatile memory (e-NVM) cells. Also by way of non-limiting example, the array of memory cells includes an array of (1S-1R) memory cells. As a further, non-limiting example, the array of memory cells comprises at least one of a resistive read only memory (RRAM) cell, a spin transfer torque memory (STTM) cell, a magnetoresistive random access memory (MRAM) cell, or combinations thereof. In some embodiments, the device layer 220 includes memory control circuitry configured to at least partially control access to the array of memory cells. In some embodiments, at least a portion of the array of memory cells is located within the ILD 230 with a portion of the ILD 230 between the device layer 220 and the at least a portion of the array of memory cells. In some embodiments, the array of memory cells is located within the ILD 230 with the ILD 230 between the device layer 220 and the array of memory cells.

In some embodiments, the device layer 220 includes a plurality of transistors. Description regarding examples of a plurality of transistors is provided below.

Figure 3:
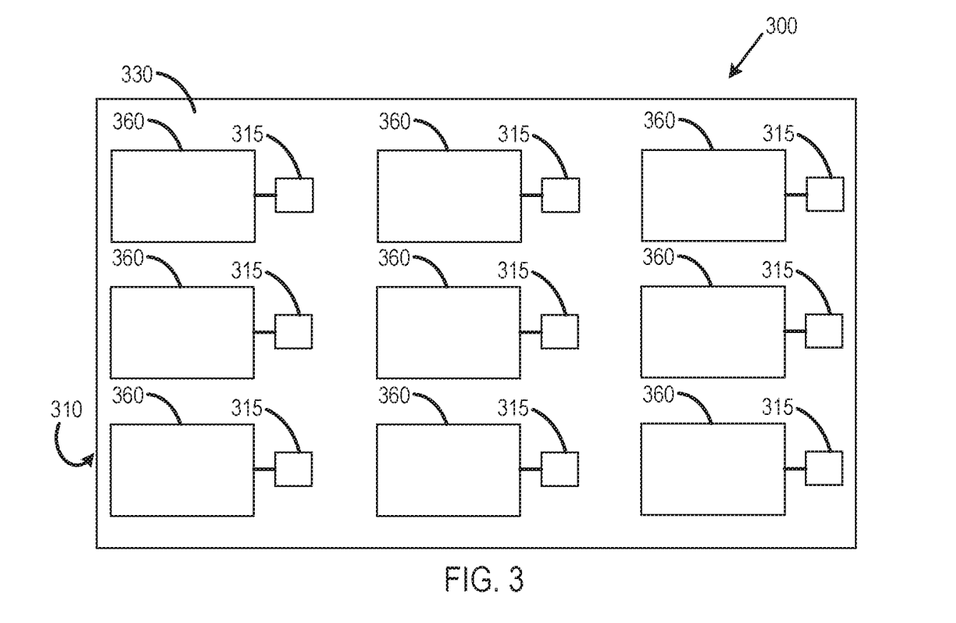
FIG. 3 is a simplified plan view of an electronic device, according to some embodiments.

FIG. 3 is a simplified plan view of an electronic device 300, according to some embodiments. As illustrated in FIG. 3, the electronic device 300 includes a plurality of electronic circuits 360 operably coupled to a plurality of heat dissipation systems 315. Each of the heat dissipation systems 315 may be similar to the heat dissipation system 315 discussed above with reference to FIG. 2. Each of the heat dissipation systems 315 is configured to dissipate heat in one or more of the electronic circuits 360. Since heat issues can vary depending on location within the electronic device 300, it may be advantageous to employ more than one heat dissipation system 315 within the same electronic device 300.

In some embodiments, the electronic device 300 includes a memory device. In some such embodiments, at least a portion of one or more of the heat dissipation systems 315 is located within an ILD 330. In some embodiments, each of the electronic circuits 360 includes a portion of the memory device. By way of non-limiting example, at least some of the electronic circuits 360 may include a portion of a memory array (e.g., a memory cell and a selector). The heat dissipation systems 315 may be configured to dissipate heat away from the memory array to prevent the temperature of the selectors in the array from varying as much as they would without the heat dissipation systems 315. For example, the heat dissipation systems may be configured to prevent the temperature of the selectors in the array from varying as much as devices in a device layer 310 beneath the ILD 330. In some embodiments, the device layer 310 may include transistors, which are more resilient to temperature fluctuations than selectors.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode is formed on the gate dielectric and may consist of at least one P-type workfunction metal or N-type workfunction metal, depending on whether the transistor is to be a PMOS or an NMOS transistor. In some implementations, the gate electrode may consist of a stack of two or more metals, where one or more metals are workfunction metals and at least one metal is a fill metal. Further metals may be included for other purposes, such as a barrier material.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal will enable the formation of an NMOS gate electrode with a workfunction that is between about 3.9 eV and about 4.2 eV.

In some implementations, when viewed as a cross-section of the transistor along the source-channel-drain direction, the gate electrode may consist of a U-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may include a combination of U-shaped structures and planar, non-U-shaped structures. For example, the gate electrode may consist of one or more U-shaped metals formed atop one or more planar, non-U-shaped materials.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. In further embodiments, one or more metals and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 4:
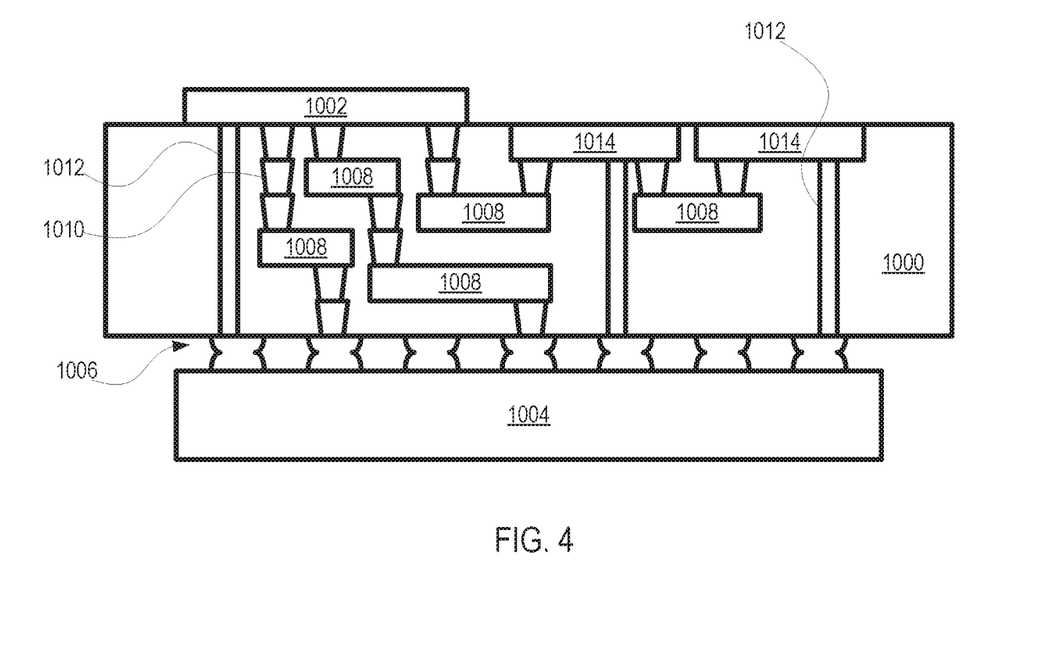
FIG. 4 illustrates an interposer that includes one or more embodiments of the disclosure.

FIG. 4 illustrates an interposer 1000 that includes one or more embodiments of the disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000.

In accordance with embodiments of the disclosure, apparatuses or processes disclosed herein may be used in the fabrication of interposer 1000. By way of non-limiting examples, the first substrate 1002, the second substrate 1004, or both may include heat compensation systems (e.g., the heat compensation systems 315 of FIGS. 2 and 3).

Figure 5:
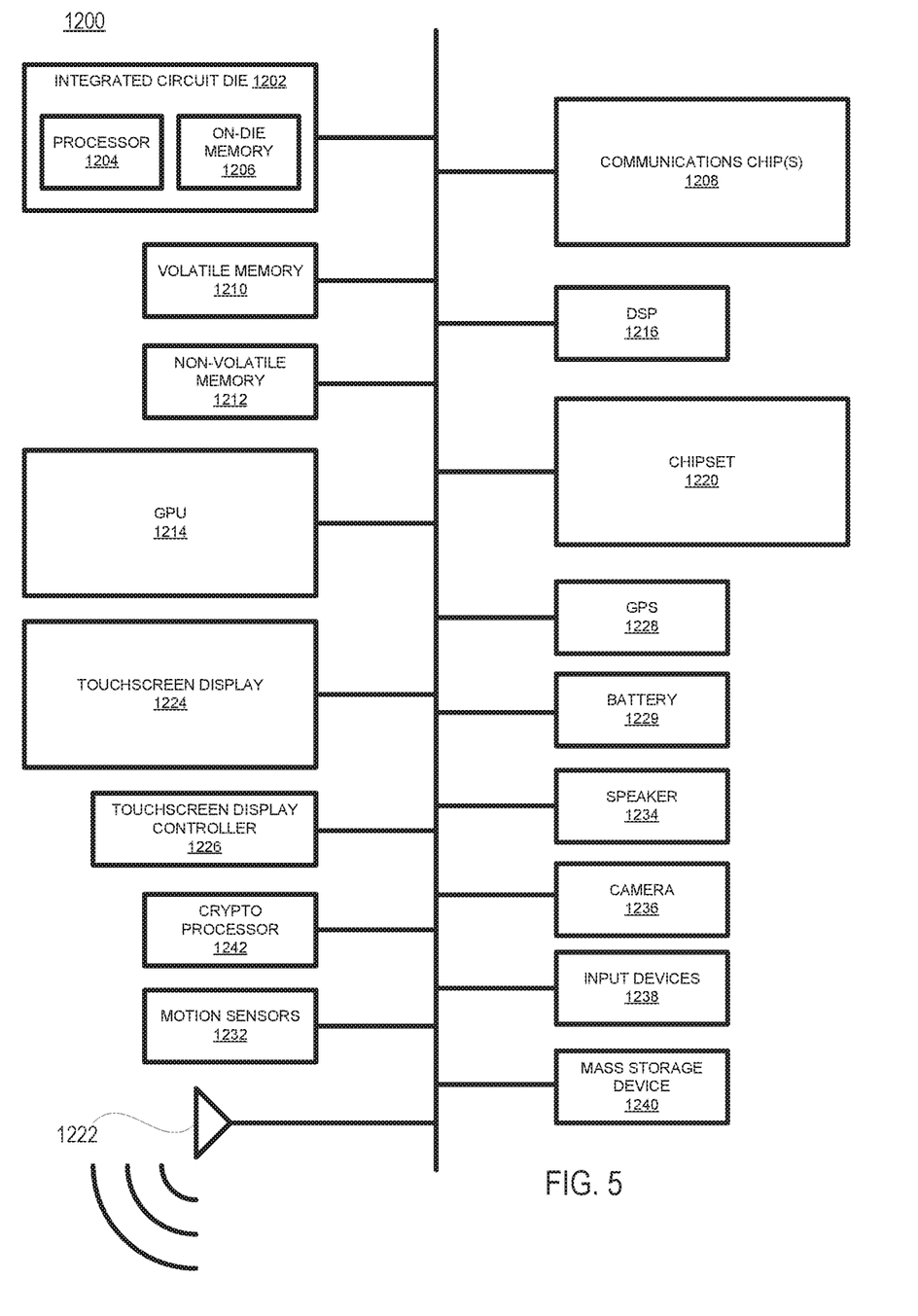
FIG. 5 illustrates a computing device in accordance with one embodiment of the disclosure.

FIG. 5 illustrates a computing device 1200 in accordance with one embodiment of the disclosure. The computing device 1200 may include a number of components. In one embodiment, these components are attached to one or more motherboards. In an alternate embodiment, some or all of these components are fabricated onto a single system-on-a-chip (SoC) die, such as an SoC used for mobile devices. The components in the computing device 1200 include, but are not limited to, an integrated circuit die 1202 and at least one communications chip 1208 (e.g., a communications logic unit). In some implementations the communications chip 1208 is fabricated within the integrated circuit die 1202 while in other implementations the communications logic unit 1208 is fabricated in a separate integrated circuit chip that may be bonded to a substrate or motherboard that is shared with or electronically coupled to the integrated circuit die 1202. The integrated circuit die 1202 may include a processor 1204 (e.g., a CPU) as well as on-die memory 1206, often used as cache memory, which can be provided by technologies such as embedded DRAM (eDRAM), SRAM, or spin-transfer torque memory (STT-MRAM).

Computing device 1200 may include other components that may or may not be physically and electrically coupled to the motherboard or fabricated within an SoC die. These other components include, but are not limited to, volatile memory 1210 (e.g., DRAM), non-volatile memory 1212 (e.g., ROM or flash memory), a graphics processing unit (GPU) 1214, a digital signal processor (DSP) 1216, a crypto processor 1242 (e.g., a specialized processor that executes cryptographic algorithms within hardware), a chipset 1220, at least one antenna 1222 (in some implementations two or more antennas may be used), a display or a touchscreen display 1224, a touchscreen display controller 1226, a battery 1229 or other power source (not shown), a power amplifier (not shown), a voltage regulator (not shown), a global positioning system (GPS) device 1228, a compass (not shown), one or more motion sensors 1232 (e.g., a motion coprocessor such as an accelerometer, a gyroscope, a compass, etc.), a microphone (not shown), a speaker 1234, a camera 1236, user input devices 1238 (such as a keyboard, mouse, stylus, and touchpad), and a mass storage device 1240 (such as hard disk drive, compact disk (CD), digital versatile disk (DVD), and so forth). The computing device 1200 may incorporate further transmission, telecommunication, or radio functionality not already described herein. In some implementations, the computing device 1200 includes a radio that is used to communicate over a distance by modulating and radiating electromagnetic waves in air or space. In further implementations, the computing device 1200 includes a transmitter and a receiver (or a transceiver)

that is used to communicate over a distance by modulating and radiating electromagnetic waves in air or space.

The communications chip 1208 may include a communications logic unit configured to transfer data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1208 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 1200 may include a plurality of communications chips 1208. For instance, a first communications chip 1208 may be dedicated to shorter range wireless communications such as Wi-Fi, NFC, and Bluetooth and a second communications chip 1208 may be dedicated to longer range wireless communications such as GPS, EDGE, GPRS, CDMA, WiMAX, LTE, Ev-DO, and others.

The processor 1204 of the computing device 1200 includes one or more devices, such as electronic circuitry thermally coupled to one or more heat dissipation systems (e.g., the heat dissipation systems 315 of FIGS. 2 and 3). The term "processor" may refer to any device or portion of a device that processes electronic data from registers and/or memory to transform that electronic data into other electronic data that may be stored in registers and/or memory.

The communications logic unit 1208 may also include one or more devices, such as electronic circuitry thermally coupled to one or more heat dissipation systems (e.g., the heat dissipation systems 315 of FIGS. 2 and 3).

In further embodiments, another component housed within the computing device 1200 may contain one or more devices, such as electronic circuitry thermally coupled to one or more heat dissipation systems (e.g., the heat dissipation systems 315 of FIGS. 2 and 3).

In various embodiments, the computing device 1200 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

In some embodiments, the computing device 1200 includes an integrated circuit structure. The integrated circuit structure includes a device layer including one or more electronic devices. The integrated circuit structure also includes an ILD on the device layer, and electronic circuitry within the ILD. The electronic circuitry is electrically connected to at least one of the one or more electronic devices of the device layer. The integrated circuit structure further includes a temperature dissipation system (e.g., the temperature dissipation system 315 of FIGS. 2 and 3) thermally coupled to the electronic circuitry and configured to selectively dissipate heat away from the electronic circuitry responsive to a detection that a temperature of the electronic circuitry exceeds a predetermined threshold temperature level. In some embodiments, at least one of the processor 1204, the memory 1206, 1210, 1212, the graphics processing unit 1214, the antenna 1222, the display 1224, the power amplifier (not shown), or the voltage regulator (not shown) includes the integrated circuit structure.

EXAMPLES

The following is a non-exhaustive list of example embodiments that fall within the scope of the disclosure. In order to avoid complexity in providing the disclosure, not all of the examples listed below are separately and explicitly disclosed as having been contemplated herein as combinable with all of the others of the examples listed below and other embodiments disclosed hereinabove. Unless one of ordinary skill in the art would understand that these examples listed below, and the above disclosed embodiments, are not combinable, it is contemplated within the scope of the disclosure that such examples and embodiments are combinable.

Example 1

An electronic device, comprising: electronic circuitry; a temperature sensor configured to monitor a temperature of the electronic circuitry; a heat sink; at least one thermoelectric material coupled to the heat sink; a thermally conductive material configured to thermally couple the electronic circuitry to the at least one thermoelectric material; and a transistor configured to selectively enable thermoelectric current to flow through the at least one thermoelectric material and dissipate heat from the thermally conductive material to the heat sink responsive to fluctuations in the temperature of the electronic circuitry detected by the temperature sensor.

Example 2

The electronic device of Example 1, further comprising control circuitry operably coupled to the temperature sensor and the transistor, the control circuitry configured to monitor an output from the temperature sensor and trigger the transistor to enable the thermoelectric current to flow responsive to an excess in the temperature above a predetermined threshold level.

Example 3

The electronic device of Example 1, wherein the electronic circuitry includes an array of memory cells.

Example 4

The electronic device of Example 3, wherein the array of memory cells includes an array of embedded non-volatile memory (e-NVM) cells.

Example 5

The electronic device of Example 3, wherein the array of memory cells includes an array of one selector, one resistor (1S-1R) memory cells.

Example 6

The electronic device of Example 3, wherein the array of memory cells comprises at least one of a resistive read only memory (RRAM) cell, a spin transfer torque memory (STTM) cell, or a magnetoresistive random access memory (MRAM) cell.

Example 7

The electronic device of Example 1, further comprising a device layer on or in a substrate and an interlayer dielectric (ILD) on the device layer, wherein at least a portion of the electronic circuitry is located within the ILD with a portion of the ILD between the at least a portion of the electronic circuitry and the device layer.

Example 8

The electronic device of Example 7, wherein: the electronic circuitry includes an array of memory cells; and the device layer includes memory control circuitry configured to at least partially control access to the array of memory cells.

Example 9

The electronic device of Example 1, wherein the thermally conductive material comprises aluminum nitride (AlN).

Example 10

The electronic device of Example 1, wherein the at least one thermoelectric material comprises a p-type thermoelectric material at a first side of the thermally conductive material and an n-type thermoelectric material on a second side of the thermally conductive material opposite the first side.

Example 11

The electronic device of Example 1, wherein the at least one thermoelectric material comprises at least one material selected from the group consisting of lead telluride (PbTe), lead telluride (1960) (PbTe 1960), lead selenide telluride (PbSeTe), antimony telluride (Sb2Te3), tellurium-antimony-germanium-silver (Te/Sb/Ge/Ag) (TAGS), a filled skutterudite (CeFe4Sb12), a zintl compound (Yb14MnSb11), silicon germanium (SiGe), bismuth telluride (Bi2Te3), a skutterudite (CoSb3), and lanthanum telluride (La3Te4).

Example 12

A memory device, comprising: an array of memory cells; a temperature sensor configured to measure a temperature of the array of memory cells; a heat dissipation system thermally coupled to the array of memory cells; and a switching device electrically coupled to the temperature sensor and configured to selectively activate the heat dissipation system to conduct heat away from the array of memory cells responsive to a detection that the temperature of the array exceeds a predetermined threshold level.

Example 13

The memory device of Example 12, wherein at least a portion of the array of memory cells is located within an interlayer dielectric (ILD) with a portion of the ILD between a device layer of the memory device and the at least a portion of the array of memory cells.

Example 14

The memory device of Example 12, wherein the array of memory cells is located within an interlayer dielectric (ILD) with the ILD between a device layer of the memory device and the array of memory cells.

Example 15

The memory device of Example 12, wherein at least a portion of the heat dissipation system is located within an interlayer dielectric (ILD).

Example 16

The memory device of Example 12, wherein the heat dissipation system comprises: a heat sink; an n-type thermoelectric material; a p-type thermoelectric material; a thermally conductive material thermally coupled between the n-type thermal conductor and the p-type thermal conductor, the thermal conductor thermally coupled to the array of memory cells; and a transistor configured to selectively enable thermoelectric current to flow through the n-type thermoelectric material and the p-type thermoelectric material to dissipate heat from the array of memory cells to the heat sink.

Example 17

A heat dissipation system of an integrated circuit structure, the heat dissipation system comprising: a heat sink; an n-type thermoelectric material; a p-type thermoelectric material; a thermally conductive material thermally coupled between the n-type thermal conductor and the p-type thermal conductor, the thermal conductor configured to thermally couple to electronic circuitry of the integrated circuit structure; a temperature sensor configured to detect a temperature of the electronic circuitry; and a transistor configured to selectively enable thermoelectric current to flow through the n-type thermoelectric material and the p-type thermoelectric material to dissipate heat from the electronic circuitry to the heat sink responsive to a detection, by the temperature sensor, that the temperature of the electronic circuitry is greater than a predetermined threshold temperature level.

Example 18

The heat dissipation system of Example 17, wherein the thermally conductive material, the n-type thermoelectric material, and the p-type thermoelectric material are located in an interlayer dielectric (ILD).

Example 19

The heat dissipation system of Example 17, wherein the thermally conductive material comprises aluminum nitride (AlN).

Example 20

The heat dissipation system of Example 17, wherein the n-type thermoelectric material comprises at least one material selected from the group consisting of lead telluride (PbTe), lead telluride (1960) (PbTe 1960), lead selenide telluride (PbSeTe), silicon germanium (SiGe), bismuth telluride (Bi2Te3), a skutterudite (CoSb3), and lanthanum telluride (La3Te4).

Example 21

The heat dissipation system of Example 17, wherein the p-type thermoelectric material comprises at least one material selected from the group consisting of lead telluride (PbTe), lead telluride (1960) (PbTe 1960), lead selenide telluride (PbSeTe), antimony telluride (Sb2Te3), tellurium-antimony-germanium-silver (Te/Sb/Ge/Ag) (TAGS), a filled skutterudite (CeFe4Sb12), a zintl compound (Yb14MnSb11), and silicon germanium (SiGe).

Example 22

A computing device, comprising: an integrated circuit structure comprising: a device layer comprising one or more electronic devices; an interlayer dielectric (ILD) on the device layer; electronic circuitry within the ILD, the electronic circuitry electrically connected to at least one of the one or more electronic devices; and a temperature dissipation system thermally coupled to the electronic circuitry and configured to selectively dissipate heat away from the electronic circuitry responsive to a detection that a temperature of the electronic circuitry exceeds a predetermined threshold temperature level.

Example 23

The computing device of Example 22, further comprising: a processor mounted on a substrate; a memory unit capable of storing data; a graphics processing unit; an antenna within the computing device; a display on the computing device; a power amplifier within the processor; and a voltage regulator within the processor; wherein at least one of the processor, the memory unit, the graphics processing unit, the antenna, the display, the power amplifier, or the voltage regulator includes the integrated circuit structure.

Example 24

A means for operating at least a portion of any one of the devices of Examples 1-23.

Example 25

A means for forming at least a portion of any one of the devices of Examples 1-23.

Example 26

A method of operating at least a portion of any one of the devices of Examples 1-23.

Example 27

A method of forming at least a portion of any one of the devices of Examples 1-23.

Example 28

A computer-readable storage medium (e.g., a non-transitory computer-readable storage medium) having computer-readable instructions stored thereon, the computer-readable instructions configured to instruct one or more processors to perform at least a portion of the method of Example 27.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. An electronic device, comprising:
a device layer on or in a substrate;
an interlayer dielectric (ILD) on the device layer;
electronic circuitry within the interlayer dielectric (ILD);
a temperature sensor having at least a portion thereof located within the ILD, the temperature sensor configured to monitor a temperature of the electronic circuitry;
a heat sink;
a thermoelectric material thermally coupled to the heat sink, the thermoelectric material within the interlayer dielectric (ILD), and the thermoelectric material having a first portion over the electronic circuitry and a second portion beneath the electronic circuitry;
a thermally conductive material configured to thermally couple the electronic circuitry to the thermoelectric material; and
a transistor configured to selectively enable thermoelectric current to flow through the thermoelectric material and dissipate heat from the thermally conductive material to the heat sink responsive to fluctuations in the temperature of the electronic circuitry detected by the temperature sensor.

2. The electronic device of claim 1, further comprising control circuitry operably coupled to the temperature sensor and the transistor, the control circuitry configured to monitor an output from the temperature sensor and trigger the transistor to enable the thermoelectric current to flow responsive to an excess in the temperature above a predetermined threshold level.

3. The electronic device of claim 1, wherein the electronic circuitry includes an array of memory cells.

4. The electronic device of claim 3, wherein the array of memory cells includes an array of embedded non-volatile memory (e-NVM) cells.

5. The electronic device of claim 3, wherein the array of memory cells includes an array of one selector, one resistor (1S-1R) memory cells.

6. The electronic device of claim 3, wherein the array of memory cells comprises at least one of a resistive read only memory (RRAM) cell, a spin transfer torque memory (STTM) cell, or a magnetoresistive random access memory (MRAM) cell.

7. The electronic device of claim 1, wherein at least a portion of the electronic circuitry is located within the ILD with a portion of the ILD between the at least a portion of the electronic circuitry and the device layer.

8. The electronic device of claim 7, wherein:
the electronic circuitry includes an array of memory cells; and
the device layer includes memory control circuitry configured to at least partially control access to the array of memory cells.

9. The electronic device of claim 1, wherein the thermally conductive material comprises aluminum nitride (AlN).

10. The electronic device of claim 1, wherein the one thermoelectric material comprises a p-type thermoelectric material at a first side of the thermally conductive material and an n-type thermoelectric material on a second side of the thermally conductive material opposite the first side.

11. The electronic device of claim 1, wherein the thermoelectric material comprises material selected from the group consisting of lead telluride (PbTe), lead telluride (1960) (PbTe 1960), lead selenide telluride (PbSeTe), antimony telluride (Sb2Te3), tellurium-antimony-germanium-silver (Te/Sb/Ge/Ag) (TAGS), a filled skutterudite (CeFe4Sb12), a zintl compound (Yb14MnSb11), silicon germanium (SiGe), bismuth telluride (Bi2Te3), a skutterudite (CoSb3), and lanthanum telluride (La3Te4).

* * * * *